(12) United States Patent
Zhang et al.

(10) Patent No.: US 6,313,479 B1
(45) Date of Patent: Nov. 6, 2001

(54) SELF-ORGANIZED FORMATION OF QUANTUM DOTS OF A MATERIAL ON A SUBSTRATE

(76) Inventors: Zhenyu Zhang, 232 Long Bow Rd., Knoxville, TN (US) 37922; John F. Wendelken, 925 Suwanee Rd., Knoxville, TN (US) 37923; Ming-Che Chang, F4-2, No. 178 Sec 5 Minsheng East Rd., Taipei (TW), 105; Woei Wu Pai, 1F, No. 17, Alley 11, Lane 202, Ming Chyuan Rd., Pan Chou City, Taipei County (TW)

( * ) Notice: Subject to any disclaimer, the term of this patent is extended or adjusted under 35 U.S.C. 154(b) by 0 days.

(21) Appl. No.: 09/395,378

(22) Filed: Sep. 14, 1999

(51) Int. Cl.$^7$ ............................................. H01L 29/06
(52) U.S. Cl. ............................................................. 257/14
(58) Field of Search .......................... 257/14; 117/85, 117/87; 427/466, 469

(56) References Cited

U.S. PATENT DOCUMENTS 5,888,885 * 3/1999 Xie ....................................... 438/493
5,997,958 * 12/1999 Sato et al. ............................. 427/468

OTHER PUBLICATIONS

Weaver, J.H. et al., *Science*, vol. 251, "Cluster Assembly of Interfaces: Nanoscale Engineering", Mar. 22, 1991, pp. 1444–1451.

Huang, Lin et al., *Physical Review Letters*, vol. 80, No. 18, Buffer–Layer–Assisted Growth in Nanocrystals: Ag–X-E–Si(111), The American Physical Society, May 4, 1998, pp. 4095–4098.

Chey et al. "Interface bonding and manipulation of Ag and Cu nanocrystals on Si(111)–(7×7)–based surfaces" Jun. 1999 Phys Rev B V59 pp16033–16041.*

* cited by examiner

*Primary Examiner*—Olik Chaudhuri
*Assistant Examiner*—Douglas A. Willie
(74) *Attorney, Agent, or Firm*—Fulbright & Jaworski

(57) ABSTRACT

Systems and methods are described for fabricating arrays of quantum dots. A method for making a quantum dot device, includes: forming clusters of atoms on a substrate; and charging the clusters of atoms such that the clusters of atoms repel one another. The systems and methods provide advantages because the quantum dots can be ordered with regard to spacing and/or size.

14 Claims, 1 Drawing Sheet

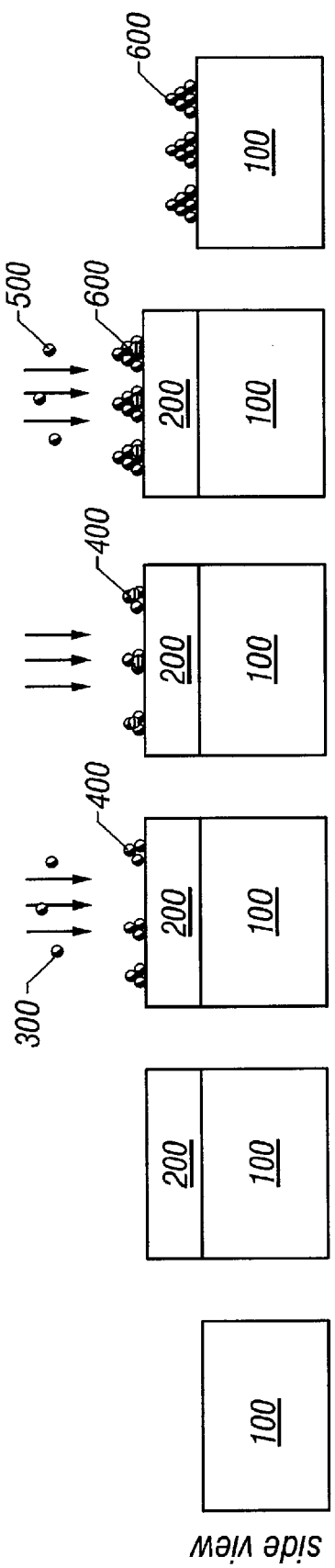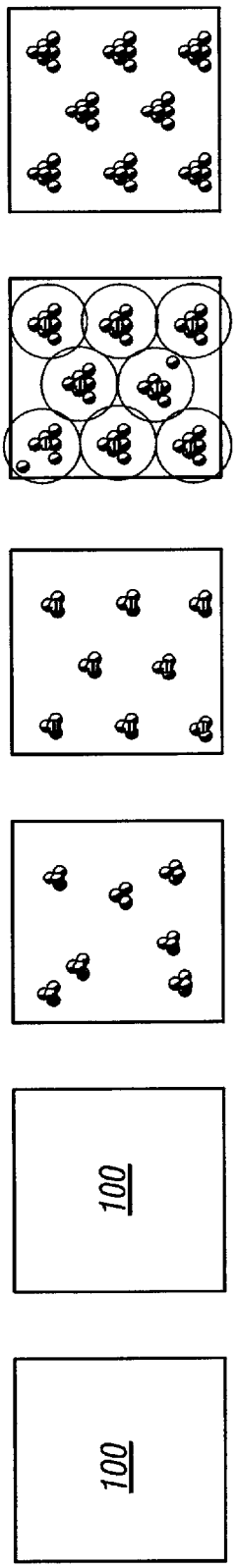

SELF-ORGANIZED FORMATION OF QUANTUM DOTS OF A MATERIAL ON A SUBSTRATE

STATEMENT AS TO RIGHTS TO INVENTIONS MADE UNDER FEDERALLY-SPONSORED RESEARCH AND DEVELOPMENT

This invention was made with Government support under contract No. DE-AC05-96OR22464 awarded by the United States Department of Energy to Lockheed Martin Energy Research Corporation, and the Government has certain rights in this invention.

BACKGROUND OF THE INVENTION

1. Field of the Invention

The invention relates generally to the field of nanotechnology. More particularly, the invention relates to systems and methods for fabricating ordered arrays of quantum dots.

2. Discussion of the Related Art

Devices that include quantum dots can be employed as computer components. In the past, three dimensional quantum dots have been formed using a buffer layer on a substrate. The use of such a buffer layer was reported by John Weaver's group at the University of Minnesota in Science (1991) and Physical Review Letters (1998).

However, this previously reported technology results in formation of quantum dots without size ordering. Specifically, the quantum dots have a wide variety of different sizes. Additionally, this technology provides quantum dots without spatial ordering. For instance, the quantum dots are often distributed unevenly across the device.

Heretofore, neither of the requirements of quantum dot size and spatial ordering referred to above has been fully met. What is needed is a solution that addresses at least one or all of these requirements. The invention is directed to meeting these requirements, among others.

SUMMARY OF THE INVENTION

A goal of the invention is to simultaneously satisfy the above-discussed requirements of quantum dot size and space ordering which, in the case of the prior art, are not satisfied.

The invention is a conceptually new approach to fabricating quantum dots. The invention includes the use of charging, and optionally, the use of a buffer layer, the combination being termed buffer layer charging (BLC).

These, and other, goals and embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts.

It should be noted that the features illustrated in the drawings are not necessarily drawn to scale.

FIGS. 1A–1B illustrate side and top schematic views of a step of providing a substrate, representing an embodiment of the invention.

FIGS. 2A–2B illustrate side and top schematic views of a step of condensing a buffer layer, representing an embodiment of the invention.

FIGS. 3A–3B illustrate side and top schematic views of a step of depositing, representing an embodiment of the invention.

FIGS. 4A–4B illustrate side and top schematic views of a step of charging and ordering, representing an embodiment of the invention.

FIGS. 5A–5B illustrate side and top schematic views of a step of enlarging, representing an embodiment of the invention.

FIGS. 6A–6B illustrate side and top schematic views of a step of landing, representing an embodiment of the invention.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

The invention can include a method of manufacturing an ordered array of quantum dots on a substrate. The method includes delivering atoms (or clusters of atoms) of a metal or semiconductor onto a substrate. As will be discussed below in more detail, the substrate can be pre-coated with an optional buffer layer. If no buffer layer is used, the substrate should be an insulating material for reasons that will also be discussed below. The method also includes charging the atoms such that the atoms repel one another, thereby migrating on the surface of the substrate. Significantly, to minimize total electrostatic energy, the atoms will develop a uniform spacing.

As mentioned above, the invention can also optionally include forming a buffer layer upon the substrate before delivering the atoms onto the substrate. The buffer layer can increase the mobility of the atoms compared to the mobility achieved by depositing the atoms directly on the substrate. When a buffer layer is used, the invention can also include removing the buffer layer from the substrate. The buffer layer can be a condensed inert gas. Removal of the buffer layer (preferably by sublimation) leaves the clusters in their repel position on the substrate.

The method can also optionally include growing clusters of atoms by delivering additional atoms of the metal or semiconductor. Each uniformly spaced atom or cluster will act as a nucleus for the additional growth. Since each cluster collects the additional atoms from approximately the same size region of the substrate, the clusters will each grow to approximately the same size. Since these resulting clusters can serve as the quantum dots for the device, the invention can increase the uniformity of quantum dot size distribution. The clusters can be grown to the size which is desired for the quantum dots of the invention as a function of the amount of additional atoms that are provided. As a result, the methods of the invention can provide a significantly increased degree of control over the size of the quantum dots.

As mentioned above, if the optional buffer layer is not used, the substrate should be an insulating material. The use of an insulating substrate helps to prevent any charge that is added to the quantum dots from quickly leaking into the substrate. It is important to note that even if the optional buffer layer is not used, the quantum dots will still need to be mobile on the substrate in order to self-organize. However, the absence of the buffer layer permits growth of the quantum dots at a much higher temperature. These higher temperatures can help to insure that the charged quantum dots still diffuse under the influence of column repulsion The use of the optional buffer layer provides two functionalities. First, charge on the quantum dots is prevented from quickly leaking away. Second, the mobility of the quantum dots for ordering purposes enhanced Embodiments of the invention that do not include the optional buffer layer or which include the use of alternative buffer layers (e.g., other than an inert gas) will work as long as the two functional aspects discussed above are effective.

The above discussed functionalities of preventing the charge on the quantum dots from quickly leaking away and providing the necessary mobility for ordering can be described as charging the clusters of atoms such that the clusters of atoms repel one another. The phrase clusters of atoms, as used herein, is defined as generic terminology for the quantum dots and/or the subsequently enlarged groups of atoms. The term approximately as used herein is defined as at least close to a given value (e.g., preferably within 10% of, more preferably within 1% of, and most preferably within 0.1% of). The term coupled as used herein, is defined as connected, although not necessarily directly, and not necessarily mechanically The invention can also include a quantum dot device formed using the above methods. Further, the invention can include processing units, such as computers, which incorporate a quantum dot device formed using the above methods.

Referring to FIGS. 1A and 1B, a substrate 100 is provided. Suitable substrates include, but are not limited to, FeMn alloy, Cu, Au, Ag, Si, and GaAs.

Referring to FIGS. 2A and 2B, a buffer layer 200 can be formed on the substrate 100. A buffer gas is delivered into an evacuated chamber (not shown in FIGS. 1A–6B) that houses the substrate. Suitable buffer gasses include, but are not limited to, inert gasses such as xenon, argon and helium. Suitable equipment for delivering and controlling the buffer gas include, but are not limited to, stainless steel tubing, mass flow controllers and vacuum pumps.

Still referring to FIGS. 2A and 2B, the buffer gas that has been delivered into the evacuated chamber is then condensed onto the substrate 100 and optionally frozen until the buffer layer 200 having a desired thickness is formed on the substrate 100. The thickness of the buffer layer 200 is preferably approximately 0.1–100 nm, more preferably 1–10 nm and most preferably 1–5 nm. This process of buffer layer condensation provides an inert layer on the substrate 100.

Referring now to FIGS. 3A and 3B, the buffer layer 200 is maintained at a temperature below the sublimation temperature of the buffer gas. Atoms 300 of a metal or semiconductor are delivered onto the buffer layer 200 using techniques such as epitaxy deposition. Other types of atoms can be delivered onto the buffer layer 200 using other techniques. This process of deposition can be termed island seeding. The incident energy of the deposited atoms of the dot materials can be just normal, namely, about the thermal energy if the deposition is by thermal evaporation. In order to avoid island nucleation around impurity atoms and thus the formation of imperfect quantum dots, the growth system should be maintained most preferably at U.V. pressure.

Still referring to FIGS. 3A and 3B, the atoms 300 of metal or semiconductor migrate on the buffer layer and form three dimensional clusters 400 on the buffer layer. Suitable atoms 300 for delivery onto the buffer layer can be determined by the intended end-use of the quantum dots.

For magnetic quantum dots, or potentially magnetic quantum dots, needed to develop ultrahigh density hard disks, the following dot/substrate materials are preferred: FeNi alloy on Fe50Mn50 alloy substrate (exchange biased pinned superparamagnetic clusters); Fe, Co, Ni on Cu (zero dimensionality effect on magnetism); and Pd, Ru, and Rh on Cu, Au, Ag (4d magnetism).

For semiconductor quantum dots needed to develop optical devices such as quantum dot lasers, the preferred systems include: IV semiconductors, such as Ge and GeSi alloy on Si; and III–V semiconductors: such as InAs and InGaAs on GaAs.

Referring now to FIGS. 4A and 4B, the clusters 400 are given a charge. The charge can be provided by delivering electrons to the clusters 400 with an electron beam or by removing electrons from the clusters 400 with techniques such as photoionization. The energy of the electrons needed to charge the dots cannot be higher than the ionization energy of the inert gas.

Still referring to FIGS. 4A and 4B, an important feature of the invention is that this charge interferes with the natural diffusion of the clusters 400 as the charged clusters begin to repel one another by Coulombic repulsion. In order to minimize the total electrostatic energy, the clusters tend to develop a uniform spacing. Thus, this process of charging can be termed an ordering process.

Referring to FIGS. 5A and 5B, cluster growth can be promoted by delivery of additional atoms 500 to the buffer layer. The resulting expanded clusters are grown to the desired size, thereby defining quantum dots 600. This enlarging process can be termed island growth.

The quantum dots 600 are preferably of a size where quantum confining of electrons can be obtained. The quantum dots 600 preferably have a maximum width of at most approximately 10 nm, more preferably at most approximately 5 nm and most preferably approximately 2 nm. Further, the quantum dots preferably have a size distribution of approximately 0.5–10 nm, more preferably approximately 1–5 mu and most preferably approximately 1–2 nm.

Still referring to FIGS. 5A and 5B, one can control the growth conditions such as the deposition flux and temperature to select the desired size and spacing of the resulting quantum dots. During the growth steps, the substrate 100 temperature should be maintained to be below the sublimation temperature of the inert gas, which for Xe is preferred to be at approximately 30–40 degrees K.

Typically, at a given temperature, the higher the deposition flux, the denser the clusters; while at a given deposition flux, the higher the growth temperature, the lower the cluster density. Therefore, one can control the deposition flux and the substrate temperature to select the spacing of the quantum dots.

The final size of the quantum dots is controlled by the total coverage of the atoms deposited onto the substrate once the spacing is determined by a given set of deposition flux and growth temperature.

Referring now to FIGS. 6A and 6B, once the quantum dots 600 are grown to the desired size, the buffer layer 200 (not shown in FIGS. 6A and 6B) can be removed by raising the temperature of the buffer layer 200. This step of buffer layer removal results in a non-destructive landing of the clusters on the substrate. As a result, the size and distribution of the quantum dots 600 on the substrate 100 is similar to the size and distribution of the clusters 400 (not shown in FIGS. 6A and 6B) on the buffer layer 200.

Still referring to FIGS. 6A and 6B, during the landing step, the temperature of the substrate 100 should be raised to be above the sublimation temperature of the inert gas, which for Xe is preferred to be above approximately 90 degrees K. In this way, the buffer layer (not shown in FIGS. 6A and 6B) is removed.

Example

A specific embodiment of the invention will now be further described by the following, nonlimiting example which will serve to illustrate in some detail various features of significance. The example is intended merely to facilitate an understanding of ways in which the invention may be practiced and to further enable those of skill in the art to practice the invention. Accordingly, the example should not be construed as limiting the scope of the invention.

The method described with regard to FIGS. 1A–6B was used to form a quantum dot device. Molecular beam epitaxy was used to deposit Fe on Cu (111) with a buffer layer of xenon at a temperature of approximately 30 degrees K. Three dimensional clusters were formed. With the addition of electrons during the growth process, the average cluster size was significantly reduced up to a factor of 30 and the size distribution was also narrower compared to an uncharged control sample. The average spacing was approximately 30 nm and the spacing distribution was also narrower compared to an uncharged control sample.

The term approximately, as used herein, is defined as at least close to a given value (e.g., preferably within 10% of, more preferably within 1% of, most preferably within 0.1% of). The term coupled, as used herein, is defined as connected, although not necessarily directly, and not necessarily mechanically.

The methods described here are likely to be adopted by major companies in the electronic, information, and optical industries in the U.S. and other countries as well. A broad variety of uses are possible in memory devices, quantum optics, and electronics where this technique may have an advantage in terms of size or spatial distributions or in materials selection. There are virtually innumerable uses for the invention, all of which need not be detailed here.

All the disclosed embodiments of the invention described herein can be realized and practiced without undue experimentation. Although the best mode of carrying out the invention contemplated by the inventors is disclosed above, practice of the invention is not limited thereto. For instance, an embodiment of the invention can be practiced without forming the buffer layer. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the quantum dot device described herein can be a physically separate module, it will be manifest that the quantum dot device may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A quantum dot device made by a process, comprising:
   forming clusters of atoms coupled to at least a portion of a substrate; and
   charging the clusters of atoms such that the clusters of atoms repel one another,
   wherein charging the clusters of atoms causes a cluster size distribution to be reduced.

2. The quantum dot device of claim 1, wherein charging the clusters of atoms causes an average cluster size to be reduced.

3. The quantum dot device of claim 1, wherein charging the clusters of atoms includes removing electrons from the clusters of atoms.

4. The quantum dot device of claim 3, wherein the electrons are removed by photoionization.

5. The quantum dot device of claim 1, wherein charging the clusters of atoms includes adding electrons to the clusters of atoms.

6. The quantum dot device of claim 5, wherein the electrons are added with an electron gun.

7. The quantum dot device of claim 1, further comprising forming a buffer layer on the substrate before forming the clusters of atoms, wherein forming clusters of atoms that are coupled to at least the portion of the substrate includes forming the clusters of atoms on the buffer layer.

8. The quantum dot device of claim 7, wherein forming the buffer layer includes condensing a buffer gas.

9. The quantum dot device of claim 8, wherein the buffer gas includes at least one inert gas.

10. The quantum dot device of claim 7 further comprising removing the buffer layer after charging the clusters of atoms.

11. The quantum dot device of claim 10, wherein removing the buffer layer includes raising a temperature of the buffer layer.

12. The quantum dot device of claim 1, further comprising growing the clusters of atoms after charging the clusters of atoms.

13. The quantum dot device of claim 1, wherein the atoms are selected from the group consisting of Fe, Co, Ni, Pd, Ru, Rh, Au, Ag, Ge, Si, In, As, and Ga.

14. The quantum dot device of claim 1, wherein the substrate includes at least one material selected from the group consisting of FeMn alloy, Cu, Au, Ag, Si, and GaAs.

* * * * *